United States Patent [19]

Hata et al.

[11] 4,177,073
[45] Dec. 4, 1979

[54] PHOTOSENSITIVE RESIN COMPOSITION COMPRISING CELLULOSE ETHER AROMATIC CARBOXYLIC ESTER

[75] Inventors: Yukinori Hata; Tsutomu Watanabe; Fumio Itoh, all of Tokyo, Japan

[73] Assignee: Oji Paper Co., Ltd., Japan

[21] Appl. No.: 852,540

[22] Filed: Nov. 17, 1977

[30] Foreign Application Priority Data

Jun. 23, 1977 [JP] Japan ................... 52-73885

[51] Int. Cl.$^2$ .................... G03C 1/52; G03C 1/68; C08L 1/00; C08L 3/00
[52] U.S. Cl. ................ 430/188; 204/159.12; 430/189; 430/197; 430/306
[58] Field of Search ............... 96/115 P, 115 R, 91 R, 96/91 D, 91 N; 204/159.12

[56] References Cited

U.S. PATENT DOCUMENTS

| | | | |
|---|---|---|---|
| 2,861,057 | 11/1958 | Merrill et al. | 96/115 R |
| 2,923,673 | 2/1960 | Munger | 204/159.12 |
| 2,927,022 | 3/1960 | Martin et al. | 96/115 P |
| 2,927,023 | 3/1960 | Martin | 96/115 R |
| 3,002,003 | 9/1961 | Merrill et al. | 96/115 R |
| 3,046,120 | 7/1962 | Schmidt | 96/33 |
| 3,502,470 | 3/1970 | Delzenne | 96/115 R |
| 3,634,082 | 1/1972 | Christensen | 96/33 |
| 3,708,305 | 1/1973 | Koyanagi et al. | 204/159.12 |
| 3,817,757 | 6/1974 | Yabe et al. | 96/115 R |
| 3,843,603 | 10/1974 | Gates | 96/115 R |
| 3,869,292 | 3/1975 | Peters | 96/115 R |
| 4,019,907 | 4/1977 | Tsunoda et al. | 96/75 |

FOREIGN PATENT DOCUMENTS

45-22082 7/1970 Japan.
51-1415 1/1976 Japan.

OTHER PUBLICATIONS

Kosar, *Light Sensitive Systems*, John Wiley & Sons, N.Y., pp. 321-353.

Primary Examiner—Richard L. Schilling
Attorney, Agent, or Firm—Paul & Paul

[57] ABSTRACT

Disclosed is a novel photosensitive composition comprising an alkali-soluble photosensitive resin and an additive consisting of at least one aromatic polybasic carboxylic cellulose ether ester which is a reaction product of an aromatic polybasic carboxylic anhydride with a cellulose ether compound of the formula (I) or (II):

$$R_a^1 R_b^2 A \qquad (I)$$

or $$R_c^3 R_d^4 R_e^5 A \qquad (II)$$

wherein $R^1$ represents a hydroxyalkyl radical having 3 or 4 carbon atoms; $R^2$ and $R^5$ are a hydrogen atom or an alkyl radical having 1 or 2 carbon atoms, respectively; $R^3$ and $R^4$ represent a hydroxyalkyl radical having 2 to 4 carbon atoms, respectively, and are different from each other; A represents a cellulose residue, and; a, b, c, d and e, respectively, represent a positive number. By using the novel photosensitive composition, the resultant coating solution is increased in its viscosity to a proper level for providing a uniform photosensitive coating film, and the resultant coating film can be provided with a high surface tenacity and resistances to scratch formation and etching solution.

9 Claims, No Drawings

PHOTOSENSITIVE RESIN COMPOSITION COMPRISING CELLULOSE ETHER AROMATIC CARBOXYLIC ESTER

The present invention relates to a photosensitive composition which is capable of being developed with an alkali aqueous solution. More particularly, the present invention relates to a photosensitive composition capable of forming a coating film with a uniform thickness, which coating film has a high adhering property to a substrate supporting the film, high capabilities of being easily developed with an alkali aqueous solution and of forming a hardened film with a high rigidity, and a high resistance to etching solution when exposed to actinic rays.

Many photosensitive resin materials which are capable of being dissolved in an organic solvent and of being developed with an alkali aqueous solution after the material is exposed to actinic rays, are already known. Examples of this types of photosensitive resin materials are:

(1) mixtures of an aromatic azido compound and a resin soluble in an alkali aqueous solution;

(2) mixtures or reaction products of at least one resin soluble in an alkali aqueous solution, for example, novolak resins, polyhydroxyphenyl resins and polycarbonate resin; with benzoquinone-(1,2) diazido and/or naphthoquinone-(1,2) diazido compound;

(3) polymers soluble in an alkali aqueous solution and having a side chain group having at least one azido radical, and;

(4) mixtures of at least one polymer soluble in an alkali aqueous solution and having, as a side chain group, an aromatic cyclic group containing at least one amino group and combined to the main chain group of said polymer with a nitrogen atom in the amino radical, with an organic radical-generating compound capable of generating radicals therefrom when the organic compound is exposed to the actinic rays.

The above-mentioned photosensitive resin materials are utilized to provide a lithographic, relief or intaglio printing material or a photoresist for etching a metal article in accordance with a desired pattern.

In the utilization of the photosensitive resin material in the above-mentioned uses, a solution of the photosensitive resin material is applied onto a surface of a substrate and dried to form a coating film having a thickness of several microns. In order to obtain the coating film having the desired small thickness, it is necessary that the solution have a proper viscosity. Also, it is necessary that the resultant coating film have a high tenacity and a high resistance to scratch formation. However, the solutions of the afore-mentioned conventional photosensitive resin materials in a concentration at which the solution can be practically used have a relatively low viscosity and, therefore, are difficult to uniformly apply in a sufficient amount on the substrate surface. Also, the resultant coating films, especially those containing the novolak resin, are easily scratched.

In order to eliminate the above-mentioned disadvantages, it has been suggested to add an additive which is soluble in organic solvents and alkali aqueous solutions, to the conventional photosensitive resin material. The additive may be selected from cellulose derivatives, such as hydroxypropyl cellulose, hydroxybutylmethyl cellulose, hydroxybutyl cellulose and hydroxyethyl cellulose; and synthetic polymers such as modified polyvinyl alcohols, modified polyvinyl acetates, polyamides, polyacrylamide, polyacryloylmorphorine, acrylic resins, isobutylene-maleic anhydride copolymers, hydroxypolystyrene, polyvinyl ethers, and styrene-maleic anhydride copolymers.

Generally speaking, the additive polymers are necessary to satisfy the following requirements.

1. The additive polymer can be dissolved together with the photosensitive resin material in the same solvent.

2. The additive polymer can improve the surface tenacity of the resultant coating film.

3. The additive polymer can increase the viscosity of the photosensitive resin material solution to a desired level.

4. The resultant coating film containing the additive polymer can be developed with an alkali aqueous solution even when the development is carried out in the absence of a development accelerator such as a surface active agent and solvent. 5. The resultant coating film containing the additive polymer has a high resistance to an etching solution.

However, the additive polymer which can satisfy all of the above-mentioned requirements has not yet been discovered. For example, an additive polymer which can increase the viscosity of the solution of the photosensitive resin material to a desired level and improve the tanacity of the resultant coating film surface, has a tendency to have a relatively low solubility in the alkali developing solution. When this type of additive polymer is used, in order to increase the dissolving property of the alkali developing solution for the resultant coating film, it is necessary to add a special solvent or surface active agent to the alkali developing solution. This addition of the special solvent or surface active agent causes the resultant alkali developing solution not only to generate an undesired odor or foam-forming property, but to produce environmental pollution.

The additive polymer easily soluble in the alkali aqueous solution, for example, the above-mentioned cellulose derivatives, can be dissolved in a limited number of organic solvents only. Also, it is known that when this type of additive polymers are used, there is a tendency toward only small increases in the tenacity of the resultant coating film surface. The above-mentioned vinyl polymers as the additive polymer have only a slight effect in increasing the viscosity of the photosensitive resin material solution. As mentioned above, no additive which can satisfy all of the afore-mentioned requirements has yet been discovered.

An object of the present invention is to provide a photosensitive composition which is not only easily soluble in organic solvents and alkali aqueous solutions, but is capable of providing a solution having a proper high viscosity for forming a uniform coating film with a desired small thickness, and also, capable of forming a coating film having a high surface tenacity and a high resistance to etching solutions.

The above-mentioned object can be attained by the photosensitive composition of the present invention which comprises: (A) a photosensitive resinous material selected from the group consisting of (1) mixtures of at least one aromatic azido compound and at least one resin selected from the group consisting of novolak resins and hydroxypolystyrene resins and (2) mixtures and reaction products of at least one resin selected from the group consisting of novolak resins and polycarbonate resins with an ortho-quinone diazido compound selected from the group consisting of benzoquinone-(1,2)-diazido and napthoquinone-(1,2)-diazido and; (B) at least one cellulose ether aromatic carboxylic ester which is a reaction product of an aromatic polybasic carboxylic anhydride with a cellulose ether compound selected from the group consisting of those of the formula (I) or (II):

$$R_a^1 R_b^2 A \qquad (I)$$

or $$R_c^3 R_d^4 R_e^5 A \qquad (II)$$

wherein $R^1$ represents a hydroxyalkyl radical having 3 or 4 carbon atoms; $R^2$ and $R^5$ are a hydrogen atom or an alkyl radical having 1 or 2 carbon atoms, respectively; $R^3$ and $R^4$ represent a hydroxyalkyl radical having 2 to 4 carbon atoms, respectively, and are different from each other; A represents a cellulose residue, and; a, b, c, d and e, respectively, represent a positive number.

The photosensitive resin usable for the photosensitive composition of the present invention is not limited to special resins and may be any conventional photosensitive resin or composition. However, the photosensitive resin usable for the present invention is required to be soluble inorganic solvents and alkali aqueous solutions prior to being exposed to actinic rays, and to be hardened and insolubilized in the alkali aqueous solutions by being exposed to actinic rays.

The cellulose ether aromatic polybasic carboxylic ester, that is, an ester of an etherified cellulose with an aromatic polybasic carboxylic acid, usable for the present invention can be produced by reacting the specified cellulose ether of the formula (I) or (II) with an aromatic polybasic carboxylic anhydride in the presence of a proper catalyst, for example, an anhydrous alkali metal acetate. The specified cellulose ether of the formula (I) may be selected from the group consisting of hydroxypropyl cellulose, hydroxybutylmethyl cellulose, hydroxypropylmethyl cellulose, hydroxybutyl cellulose, hydroxypropylethyl cellulose, and hydroxybutylethyl cellulose. Also, the specified cellulose ether of the formula (II) may be selected from the group consisting of hydroxypropyl-hydroxyethyl cellulose, hydroxybutyl-hydroxyethyl cellulose, hydroxybutyl-hydroxypropyl cellulose, hydroxypropyl-hydroxyethylmethyl cellulose, hydroxypropyl-hydroxyethylethyl cellulose, hydroxybutyl-hydroxyethylmethyl cellulose, hydroxybutyl-hydroxyethylethyl cellulose, hydroxybutyl-hydroxypropylmethyl cellulose and hydroxybutyl-hydroxypropylethyl cellulose.

In the above-mentioned cellulose ethers, it is preferable that the cellulose main chain has a degree of polymerization of from 50 to 100.

The aromatic polybasic carboxylic anhydride usable for the present invention may be selected from the group consisting of phthalic anhydride, tetrahydrophthalic anhydride, trimellitic anhydride and hexahydrophthalic anhydride.

Concerning the cellulose ether aromatic polybasic carboxylic ester usable for the present invention, it is preferable that the content of the aromatic carboxylic acid residue be in a range of from 23 to 67% based on the weight of the cellulose ether aromatic polybasic carboxylic ester. In the photosensitive composition of the present invention, it is preferable that the content of said cellulose ether aromatic polybasic carboxylic ester is in a range of from 5 to 40%, more preferably, 10 to 30%, based on the total weight of the solid components in said composition.

The following description will illustrate the photosensitive resin usable for the photosensitive composition of the present invention.

The photosensitive resin may be optionally selected from the afore-mentioned conventional photosensitive resin materials.

The aromatic azido compound which may be contained in the photosensitive resin, can be selected from conventional aromatic azido compounds which can insolubilize the alkali-soluble photosensitive resin when it is exposed to actinic rays. Usually, the aromatic azido compound may be selected from the group consisting of 4,4'-diazidostilbene, 4,4'-diazidocalcon, 4,4'-diazidobenzophenone, 2,6-bis(4'-azidobenzylidene) cyclohexanone, 1-azidopyrene, 1,6-diazidopyrene, 6-azido-2(4'-azidostilyl)benzoimidazole, 3,4'-dimethoxy-4,4'-diazidobiphenylene, 2-(4'-methoxyanilino)-5-azidobenzoic methyl ester, 2-anilino-5-azidobenzoic acid and -2-(4'-azidophenyl)-6-methylbenzothiazole. The alkali-soluble photosensitive resin may be selected from the group consisting of phenol novolak resins, cresol novolak resins, copolymeric novolak resins containing phenol and/or cresol and an alkylphenol in which the alkyl group has 3 to 15 carbon atoms, and hydroxypolystyrene resins.

A photosensitive composition of the present invention comprising the aromatic azido compound, the photosensitive resin soluble in the alkali aqueous solution and the cellulose ether aromatic polybasic carboxylic ester, is most useful. In order to prepare a photosensitive coating film by using this type of photosensitive composition, the above-mentioned components of the photosensitive composition are dissolved in an organic solvent, for example, ethylene glycol ethers, ethylene glycol esters, cyclohexanone, dioxane, butyl acetate, alcohols, and mixtures of two or more of the above-mentioned compounds. The resultant solution preferably has a total concentration of the solid components of from 1 to 30%. The solution is uniformly applied onto a surface of a substrate, for example a metal plate, for instance, aluminium, zinc, magnesium or copper plate, a plastic plate or film, or a laminate paper, by using a conventional coating method, for example, spraying, dipping, wheeler coating, roll coating or doctor coating method. The applied solution is, then, dried and a photosensitive coating film is obtained. The photosensitive resin usable for the present invention may comprise a mixture or reaction product of at least one resin soluble in alkali aqueous solution and selected from the group consisting of novolak resins, polyhydroxyphenol resins and polycarbonate resins with an ortho-quinone diazido compound selected from benzoquinone-(1,2)-diazido and naphthoquinone-(1,2)diazido. The ortho-quinone diazido compound may have a sulfonic ester group or carboxylic ester group or may be in the form of amine salt. The ortho-quinone diazido compound may be used in the form of sulfonic ester or carboxylic ester of a hydroxyl compound, for example, a phenol novolak resin, m-cresol novolak resin, polyvinyl phenol resin or polypropenylphenol resin.

The photosensitive composition comprising the above-mentioned mixture or reaction product and the cellulose ether aromatic polybasic carboxylic ester compound, is dissolved in a total solid concentration of from 5 to 40% in a solvent, for example, ethylene glycol ether, ethylene glycol ester, dioxane, alcohol or a mixture of two or more of the above-mentioned compounds. The resulting solution is applied onto a substrate surface and dried to provide a photosensitive coating film. The photosensitive resin may comprise a polymer which is soluble in an alkali aqueous solution and has a side chain group containing an azido radical, that is, azido polymer. This azido polymer may be selected from the following polymers;

(A) Azidobenzoates of partially saponified polyvinyl acetate, having polymerizing units of the formula:

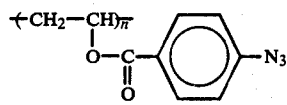

(B) Polyvinylazidobenzal of the formula:

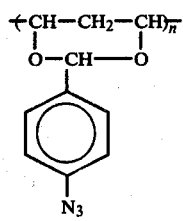

(C) Novolak resins having a polymerized unit of the formula:

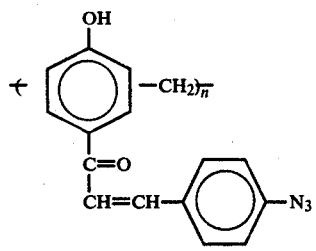

The photosensitive resin usable for the present invention may be a conventional photosensitive diazo resin. Usually, a condensation product of p-diazodiphenylamine with formaldehyde is used as the photosensitive diazo resin. When this type of photosensitive diazo resin is used, the resultant photosensitive composition of the present invention is soluble in methanol, ethyl acetate and ethylene glycol ethers.

The photosensitive resin usable for the present invention may also comprise a mixture of at least one polymer soluble in an alkali aqueous solution and having as a side chain group, an aromatic cyclic group containing at least one amino radical and combined to the main chain group of said polymer with a nitrogen atom in said amino radical, with an organic radical-generating compound having a polyhalogenated methyl group and being capable of generating therefrom radicals when the organic compound is exposed to actinic rays. This type of polymer may be selected from the group consisting of N-ethyl-N-phenylaminoethyl methacrylate resins, N-ethyl-N-phenylaminoethyl methacrylamide resins, 1-methacryloyl-2-phenylhydrazine resins, 2-propenyldiphenyl-amine resins, vinylmethylnaphthylamine resine, vinylmethylphenylamine resins, vinyldiphenylamine resins, vinylphenylnaphthylamine resins, N-phenyl-N-acryloylhydrazine resins, maleic-half-p-anilinophenylamide resin and copolymer resins of at least one monomer of the above-mentioned resines with at least one ethylenically unsaturated monomer.

In the above-mentioned copolymers, the ethylenically unsaturated monomer may be selected from ethylene, propylene, styrene, acrylic acid, methacrylic acid and maleic acid. The radical-generating agent mentioned above may be selected from 2,2,2-tribromoethanol, p-nitro-$\alpha,\alpha$, $\alpha$-tribromoacetophenone, $\omega,\omega,\omega$-tribromoquinaldine, 2-$\omega,\omega,\omega$-tribromomethyl-5-nitroquinone, 2-$\omega,\omega,\omega$-trichloromethyl-6-nitrobenzothiazole, $\alpha$-$\omega,\omega$-dibromomethyl-4-chloropyridine, hexabromodimethylsulfoxide, tribromomethylphenylsulfone, 4-nitrotribromomethylphenylsulfone and 2-tribromomethylsulfonylbenzothiazole. The above-mentioned type of photosensitive resin can be dissolved together with the cellulose ether aromatic polybasic carboxylic ester in the organic solvent described hereinbefore. The resultant solution can be converted into a photosensitive coating film by using the afore-mentioned coating method.

The coating film prepared, on a substrate, by using the photosensitive composition of the present invention is exposed in accordance with a desired pattern to actinic rays, for example, ultraviolet rays and sunlight, for a necessary time. During the exposure, the exposed portions of the coating film are hardened and insolubilized to an alkali aqueous solution. The source of the actinic rays may be a conventional artificial light source, for example, carbon-arc lamp, mercury-arc lamp and xenon lamp.

The exposed coating film is subjected to development with a developing solution having a pH of 11.5 to 14.0, for example, an alkali aqueous solution containing sodium metasilicate, sodium hydroxide, trisodium phosphate or sodium carbonate alone or a mixture of two or more of the above-mentioned compounds. In the development of the coating film provided by using the photosensitive composition of the present invention, usually, it is unnecessary to add an auxiliary developing agent, for example, a surface active agent and solvent, to the developing solution. However, the developing solution may contain any one of the above-mentioned auxiliary developing agents. The developing operation is carried out at a temperature of from 20 to 35° C. for from 30 seconds to 2 minutes. This operation may be effected by using a conventional vatting method or showing method.

The developed coating film of the photosensitive composition of the present invention formed on the substrate is usable as a lithographic printing plate. Otherwise, the substrate on which the developed coating film is fixed can be etched with an acid etching solution so as to provide a photographic relief printing plate.

the photosensitive composition of the present invention can be dissolved in an organic solvent to provide a solution having a proper viscosity for evenly coating the solution in a desired thickness on a substrate by using a conventional coating device, for example, roll coater, in only one coating operation. This is because the photosensitive composition of the present invention contains, as an additive, the specified cellulose ether aromatic carboxylic ester. The resultant coating film not only has an excellent surface tenacity, but can be easily developed with the alkali solution alone without using the auxiliary developing agent. Therefore, in the case where the photosensitive composition of the present invention is utilized, the developing cost is low and the developing solution has no undesirable odor, foam-generating property and skin-irritating effect due to the absence of the auxiliary developing agent.

The present invention will be further illustrated by the following examples, which are provided for the purpose of illustration and should not be interpreted as in any way limiting the scope of the present invention.

EXAMPLES 1 THROUGH 3 AND

Comparison Examples 1 through 4

In each of Examples 1 through 3 and Comparison Examples 1 through 4, a photosensitive coating solution was prepared from the following composition.

| Composition of photosensitive coating solution | |
|---|---|
| 1-azidopyrene | 4g |
| m-cresol novolak resin | 20g |
| Additive polymer shown in Table 2 | 8g |
| Dye | 1g |
| Diethylene glycol diethylether | 100ml |

The viscosity of the coating solution was determined by using a B type viscometer with a rotor No. 1 rotating at a speed of 30 rpm, at a temperature of 20° C.

The coating solution was applied to a surface of a surface-ground zinc plate for photo-relief printing, by using a roll coater, and dried by using an infra-red ray dryer. The dried coating film had a thickness of 3 microns. A photosensitive printing plate was obtained.

A negative film having a predetermined pattern was placed on the dried coating film surface and exposed for 30 seconds to actinic rays from a 2 KW super voltage mercury lamp spaced 50 cm from the negative film. The exposed photosensitive printing plate was subjected to a developing process wherein the coating film was treated with a developing solution containing 1% of sodium hydroxide, at a temperature of 40° C., for 40 seconds, by using a vatting developing device.

After the completion of the developing process, it was observed that in each of Examples 1 through 3, the portions of the coating films which were not exposed to the actinic rays, were completed removed, in spite of the absence of the auxiliary developing agent, and very clear and accurate images were obtained. However, in each of Comparison Examples 6 through 9, the unexposed portions of the coating film were incompletely removed due to the lack of the auxiliary developing agent in the developing solution.

The photosensitive printing plates developed in Examples 1 through 3 were subjected to a powderless etching process in which an etching solution containing 15% of nitric acid and 4% of a powderless additive was used, at a temperature of 30° C., for 8 minutes. The etching solution was stirred with a stirring paddle.

The products of Comparison Examples 1 through 4 were not subjected to the etching process because of the incomplete development thereof.

In Examples 1 through 3, by the etching process, photo-relief printing plates were obtained. It was also observed that the developed coating film of Examples 1 through 3 had an excellent resistance to the acid etching solution.

The results of Examples 1 through 3 and Comparison Examples 1 through 4 are shown in Table 1.

Table 1

| Example No. | Additive polymer | | | Viscosity of coating solution (cps) | Developing process | Hardened coating film | |
|---|---|---|---|---|---|---|---|
| | Compound | Substituent group | Degree of substitution (MS) | | | Resistance to acid etching solution | Pencil hardness |
| Example 1 | Hydroxypropyl cellulose tetrahydrophthalic monoester | Hydroxypropyl group Tetrahydrophthalic monoester group | 3.0 1.65 | 100 | completed | good | 5H |
| 2 | Hydroxypropylmethyl cellulose phthalic monoester | Hydroxypropyl group Methyl group Phthalic monoester group | 0.27 1.87 0.85 | 100 | completed | good | 5H |
| 3 | Hydroxybutylhydroxypropylmethyl cellulose hexahydrophthalic monoester | Hydroxybutyl group Hydroxypropyl group Methyl group Hexahydrophthalic monoester group | 0.17 0.27 1.43 0.90 | 100 | completed | good | 5H |
| Comparison Example 1 | Acrylic resin | — | — | 100 | incompleted | — | 2H |
| 2 | Hydroxypropyl cellulose | — | — | 150 | incompleted | — | 5H |
| 3 | Methyl cellulose | Methoxy group | 0.33 | 150 | incompleted | — | 4H |
| 4 | Carboxymethyl cellulose | Carboxymethyl group | 0.33 | 150 | incompleted | — | 4H |

EXAMPLES 4 THROUGH 6 AND

Comparison Examples 5 through 7

In each of Examples 4 through 6 and Comparison Examples 5 through 7, a photosensitive coating solution was prepared from the following composition.

| Composition of photosensitive coating solution | |
|---|---|
| Reaction product of 1,2-benzoquinone-2-diazido-4-sulfonyl chloride with phenol novolak resin | 5g |
| Phenol novolak resin | 10g |
| Additive polymer shown in Table 3 | 4g |
| Dye | 1g |
| Ethylene glycol monoethylether | 100ml |

The viscosity of the coating solution was determined by using a B type viscometer with a rotor No. 1 rotating at a speed of 30 rpm, at a temperature of 20° C.

The coating solution was applied to a surface of a surface-ground copper foil, having a thickness of 50 microns of a printed circuit laminate, by using a roll coater, and dried by using an infra-red ray dryer. The dried coating film had a thickness of 3 microns. A photosensitive laminate for converting to a printed circuit laminate was obtained.

A positive film having a predetermined printed circuit pattern was placed on the dried coating film surface, and exposed for 60 seconds to actinic rays from a 2 KW super voltage mercury lamp spaced by 50 cm from the positive film. The exposed coating film was developed with a developing solution containing 0.5% of sodium hydroxide alone, at a temperature of 30° C., for 60 seconds, by using a vatting developing device.

After the completion of the developing process, it was observed that in each of Examples 4 through 6, the portions of the coating films which were exposed to the actinic rays, were completely removed, in spite of the absence of the auxiliary developing agent, and very clear and accurate images of the printed circuit were obtained. However, in each of Comparison Examples 5 through 7, the exposed portions of the coating film were incompletely removed due to the lack of the auxiliary developing agent in the developing solution.

The laminates developed in Examples 4 through 6 were subjected to a powderless etching process in which an etching solution containing 40° Be $FeCl_3$ was used, at a temperature of 23° C., for 3 minutes. The etching solution was stirred with a stirring paddle.

The products of Comparison Examples 5 through 7 were not subjected to the etching process because of the incomplete development thereof.

In Examples 4 through 6, by the etching process, printed circuit laminates were obtained. It was also observed that the developed coating film of Examples 4 through 6 had an excellent resistance to the acid etching solution.

The results of Examples 4 through 6 and Comparison Examples 5 through 7 are shown in Table 2.

What we claim is:
1. A photosensitive composition comprising:
(A) a photosensitive resinous material selected from the group consisting of

(1) mixtures of at least one aromatic azido compound and at least one resin selected from the group consisting of novolak resins and hydroxypolystyrene resins and
(2) mixtures and reaction products of at least one resin selected from the group consisting of novolak resins and polycarbonate resins with an ortho-quinone diazido compound selected from the group consisting of benzoquinone- (1,2)-diazido and naphthoquinone-(1,2)-diazido, and;
(B) at least one cellulose ether aromatic carboxylic ester which is a reaction product of an aromatic polybasic carboxylic anhydride with a cellulose ether compound selected from the group consisting of those of the formulae (I) and (II);

and

wherein $R^1$ represents a hydroxyalkyl radical having 3 or 4 carbon atoms; $R^2$ and $R^5$ are a hydrogen atom or an alkyl radical having 1 or 2 carbon atoms, respectively; $R^3$ and $R^4$ represent a hydroxyalkyl radical having 2 to 4 carbon atoms, respectively, and are different from each other; A represents a cellulose residue, and; a, b, c, d and e, respectively, represent a positive number.

2. A photosensitive composition as claimed in claim 1, wherein the content of said cellulose ether aromatic carboxylic ester is in a range of from 5 to 40% based on the total weight of the solid components in said composition.

3. A photosensitive composition as claimed in claim 1, wherein said cellulose ether of the formula (I) is selected from hydroxypropyl cellulose, hydroxybutylmethyl cellulose, hydroxypropylmethyl cellulose, hydroxybutyl cellulose, hydroxypropylethyl cellulose, and hydroxybutylethyl cellulose.

4. A photosensitive composition as claimed in claim 1, wherein said cellulose ether of the formula (II) is selected from hydroxypropyl-hydroxyethyl cellulose, Table 2

| Example No. | Additive polymer | | | Viscosity of Coating solution (cps) | Developing process | Hardened coating film | |
|---|---|---|---|---|---|---|---|
| | Compound | Substituent group | Degree of Substitution (Ms) | | | Resistance to acid etching solution | Pencil hardness |
| Example 4 | Hydroxypropyl cellulose tetrahydrophthalic monoester | Hydroxypropyl group Tetrahydrophthalic monoester group | 3.0 1.65 | 130 | completed | good | 4H |
| 5 | Hydroxypropylmethyl cellulose phthalic monoester | Hydroxypropyl group Methyl group Phthalic monoester group | 0.27 1.87 0.85 | 130 | completed | good | 4H |
| 6 | Hydroxybutyl hydroxypropylmethyl cellulose hexahydrophthalic monoester | Hydroxybutyl group Hydroxypropyl group Methyl group Hexahydrophthalic monoester group | 0.17 0.27 1.43 0.90 | 140 | completed | good | 4H |
| Comparison Example 5 | Acrylic resin | — | — | 50 | incompleted | — | 2H |
| 6 | Hydroxypropyl cellulose | — | — | 180 | incompleted | — | 5H |
| 7 | Methyl cellulose | Methoxy group | 0.33 | 120 | incompleted | — | 4H | hydroxybutyl-hydroxyethyl cellulose, hydroxybutyl-hydroxypropyl cellulose, hydroxypropyl-hydroxyethylmethyl cellulose, hydroxypropyl-hydroxyethylethyl cellulose, hydroxybutyl-hydroxyethylmethyl cellulose, hydroxybutyl-hydroxyethylethyl cellulose, hydroxybutyl-hydroxypropylmethyl cellulose and hydroxybutyl-hydroxypropylethyl celluose.

5. A photosensitve composition as claimed in claim 1, wherein said aromatic polybasic carboxylic anhydride is selected from phthalic anhydride, tetrahydrophthalic anhydride, trimellitic anhydride and hexahydrophthalic anhydride.

6. A photosensitive composition as claimed in claim 1, wherein said cellulose ether aromatic carboxylic ester contains 23 to 67%, based on the weight of thereof, of an aromatic carboxylic acid residue.

7. A photosensitive composition as claimed in claim 1, wherein said aromatic azido compound is selected from 4,4'-diazidostilbene, 4,4'-diazidocalcon, 4,4'-diazidobenzophenone, 2,6-bis(4'-azidobenzylidene)cyclohexanone, 1-azidopyrene, 1,6-diazidopyrene, 6-azido-2(4'-azidostilyl)benzoimidazole, 3,4'-dimethoxy-4,4'-diazidobiphenylene, 2-(4'methoxyanilino)-5-azidobenzoic methylester, 2-anilino-5-azidobenzoic acid and 2-(4'-azidophenyl)-6-methylbenzothiazole.

8. A photosensitive composition as claimed in claim 1, wherein said novolak resin is selected from the group consisting of phenol novolak resins, cresol novolak resins and copolymeric novolak resins containing at least one member selected from the group consisting of phenol and cresol and an alkylphenol in which the alkyl group contains 3 to 15 carbon atoms.

9. A photosensitive composition as claimed in claim 1, wherein said ortho-quinone diazido compound has at least one of the sulphonic ester and carboxylic ester groups.

* * * * *

UNITED STATES PATENT OFFICE
CERTIFICATE OF CORRECTION

Patent No. 4,177,073                Dated Dec. 4, 1979

Inventor(s) Yukinori Hata et al

It is certified that error appears in the above-identified patent and that said Letters Patent are hereby corrected as shown below:

Column 2, line 28 "tanacity" should be --tenacity--

Column 4, line 9 "compound" should be --compounds--

Column 6, line 48 "showing" should be --showering--

Column 6, line 56 "the" should be --The--

Column 7, line 4 "ofthe" should be --of the--

Signed and Sealed this

*Twenth-eighth* Day of *September 1982*

[SEAL]

*Attest:*

*Attesting Officer*

GERALD J. MOSSINGHOFF

*Commissioner of Patents and Trademarks*